United States Patent
Peng et al.

(10) Patent No.: US 7,777,540 B2
(45) Date of Patent: Aug. 17, 2010

(54) PHASE LOCKED LOOP, LOCK DETECTOR AND LOCK DETECTION METHOD

(75) Inventors: Jinzhong Peng, Shanghai (CN); Zhigang Fu, Shanghai (CN); Juncheng Wang, Shanghai (CN); Dongxiang Luo, Shanghai (CN); Qinglong Lin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/390,324

(22) Filed: Feb. 20, 2009

(65) Prior Publication Data
US 2010/0039151 A1    Feb. 18, 2010

(30) Foreign Application Priority Data
Aug. 18, 2008    (CN)    ......................... 2008 1 0041829

(51) Int. Cl.
*H03L 7/06* (2006.01)
(52) U.S. Cl. ...................................... 327/156; 327/147
(58) Field of Classification Search ................. 327/147, 327/149, 156, 158
See application file for complete search history.

(56) References Cited

U.S. PATENT DOCUMENTS

| | | | | |
|---|---|---|---|---|
| 5,483,558 A * | 1/1996 | Leon et al. | ................... | 375/376 |
| 6,314,150 B1 * | 11/2001 | Vowe | .......................... | 375/374 |
| 7,454,645 B2 * | 11/2008 | Li et al. | ....................... | 713/500 |
| 7,676,014 B2 * | 3/2010 | Chen et al. | ................... | 375/376 |
| 7,696,798 B2 * | 4/2010 | Pendurkar | ..................... | 327/156 |
| 2006/0164138 A1 * | 7/2006 | Kakuta | ......................... | 327/156 |
| 2006/0224910 A1 * | 10/2006 | Li et al. | ....................... | 713/500 |
| 2006/0226914 A1 * | 10/2006 | Saado | .......................... | 331/1 A |
| 2006/0280276 A1 * | 12/2006 | Chen et al. | ................... | 375/376 |
| 2007/0071155 A1 * | 3/2007 | Boerstler et al. | ............. | 375/376 |
| 2008/0116983 A1 * | 5/2008 | Kinugasa et al. | ............... | 331/25 |
| 2009/0079479 A1 * | 3/2009 | Chen | ........................... | 327/156 |
| 2009/0207961 A1 * | 8/2009 | Sai | .............................. | 375/375 |
| 2009/0251226 A1 * | 10/2009 | Kathuria et al. | ............. | 331/1 R |
| 2010/0039151 A1 * | 2/2010 | Peng et al. | ................... | 327/156 |

* cited by examiner

*Primary Examiner*—Lincoln Donovan
*Assistant Examiner*—Adam D Houston
(74) *Attorney, Agent, or Firm*—Squire, Sanders & Dempsey, L.L.P.

(57) ABSTRACT

The present invention discloses a PLL, a lock detector thereof and a lock detection method. The lock detector includes: a first detecting unit, adapted to compare a counting value of a reference clock signal with a counting value of a feedback clock signal every first interval and output a valid first prelock signal when the counting value of the reference clock signal is equal to the counting value of the feedback clock signal; a second detecting unit, adapted to output a valid second prelock signal when the counting value of the reference clock signal is equal to the counting value of the feedback clock signal during a second interval which is at least two times higher than the first interval; a third detecting unit, adapted to output a valid lock signal if the first prelock signal output from the first detecting unit every first interval is valid and the second prelock signal output from the second detecting unit is valid during the second interval. The PLL, lock detector thereof and lock detection method can detect the lock state quickly and correctly.

22 Claims, 7 Drawing Sheets

PHASE LOCKED LOOP, LOCK DETECTOR AND LOCK DETECTION METHOD

This application claims the priority of Chinese Patent Application No. 200810041829.0, filed Aug. 18, 2008, the entire disclosure of which is incorporated herein by reference.

FIELD OF THE INVENTION

The present invention relates to a Phase Locked Loop (PLL), a lock detector and a lock detection method.

BACKGROUND OF THE INVENTION

The PLL is widely applied in a System on Chip (SOC) to provide accurate and stable clock signal. FIG. 1 is a basic structure of a PLL, including a Phase Frequency Detector (PFD) 11, a Charge Pump (CP) 12, a Loop Filter (LP) 13, a Voltage Control Oscillator (VCO) 14 and a frequency divider 15.

The PFD 11 detects a frequency difference and a phase difference between a reference clock signal $F_{ref}$ and a feedback clock signal $F_{fb}$, and generates pulse control signals UP and DN and sends them to the CP 12. In the CP 12, the pulse control signals UP and DN are converted into current $I_p$ so as to charge or discharge a capacitor $C_p$ in the LP 13. The LP 13 generates and sends a control voltage $V_{ctrl}$ to the VCO 14. The VCO 14 increases an oscillation frequency of the clock signal $F_{out}$ as the control voltage $V_{ctrl}$ is increased, and the VCO 14 decreases the oscillation frequency of the clock signal $F_{out}$ as the control voltage $V_{ctrl}$ is decreased. An output clock signal $F_{out}$ of the VCO 14 generates the feedback clock signal $F_{fb}$ via the frequency divider 15. Thus, the above devices form a feedback system. When the frequency and phase of the output clock signal $F_{out}$ are locked to a fixed frequency and phase. The PLL is in a lock status.

The accuracy and stability of the output clock signal of the PLL directly affects an operation of a next stage circuit in SOC. Thus, the lock detector for detecting the lock status of the PLL is necessary. When the PLL is in the lock status, the lock detector outputs a valid lock signal (such as digital signal 1) to the next stage circuit so as to activate the next stage circuit.

A conventional lock detector counts the reference clock signal and the feedback clock signal during a time period. If the counting value of the reference clock signal during the time period is equal to that of the feedback clock signal, the lock detector outputs a valid lock signal. This lock detector has a simple structure but can not reflect the lock status of PLL accurately. Because the feedback clock signal may not be stabilized (fast or slow) before the PLL is locked, it is possible that the lock detector can not obtain the lock status correctly. If the time period is short, it is possible that the counting value of the reference clock signal during the time period is equal to that of the feedback clock signal though the output clock signal of the PLL is not stable. Thus, the lock status is detected erroneously. In order to accurately detect the lock status of the PLL, the time period is configured to long enough. However, even the output clock signal is already stabilized, the next stage circuit will be activated after the time period elapses. Hence, the lock status of the PLL can not be detected in time.

Another conventional lock detector compares the phases of the reference clock signal with the feedback clock signal. When the phase difference between the reference clock signal and the feedback clock signal is within a predetermined range (such as 500 ps-1000 ps), a valid lock signal is output. However, this lock detector may also detect the lock status erroneously due to the unstable feedback clock signal. Moreover, due to the large frequency division factor of the frequency divider and the affection of the charging or discharging current of the CP, the jitter of the VCO is accumulated. Thus, it is possible that the phase difference between the reference clock signal and the feedback clock signal goes beyond the predetermined range even the output clock signal is stabilized.

Detailed descriptions regarding other structures of lock detectors for PLL are disclosed in other documents such as U.S. Pat. No. 6,320,469 and Chinese patent application No. 200580006798.X.

SUMMARY OF THE INVENTION

An object of the present invention is to provide a PLL, a lock detector and a lock detection method so as to detect the lock status of the PLL accurately and quickly.

To achieve the above object, the present invention provides a lock detector for a PLL, including:

a first detecting unit, adapted to compare a counting value of a reference clock signal with a counting value of a feedback clock signal every first interval and output a valid first prelock signal when the counting value of the reference clock signal is equal to the counting value of the feedback clock signal;

a second detecting unit, adapted to output a valid second prelock signal when the counting value of the reference clock signal is equal to the counting value of the feedback clock signal during a second interval which is at least two times higher than the first interval;

a third detecting unit, adapted to output a valid lock signal if the first prelock signal output from the first detecting unit every first interval is valid and the second prelock signal output from the second detecting unit is valid during the second interval.

Optionally, the first interval and the second interval are integral multiples of a period of the reference clock signal.

Optionally, a ratio between the first interval to the period of the reference clock signal is equal to or less than 32 and a ratio between the second interval to the period of the reference clock signal is larger than or equal to 128.

Optionally, the first detecting unit includes: a first counting unit, adapted to count the reference clock signal and the feedback clock signal, output a first reference counting value and a first feedback counting value, the number of bits for the counting value is determined by the first interval; a first logic unit, adapted to generate a first signal which generates an effective edge every the first interval according to the first reference counting value; a first comparing unit, adapted to compare the first reference counting value with the first feedback counting value and output a comparison result as a first prelock signal at the effective edge of the first signal.

Optionally, the second detecting unit includes: a second counting unit, adapted to count the reference clock signal and the feedback clock signal respectively, output the second reference counting value and the second feedback counting value, the number of bits for the counting value is determined by the second interval; a second logic unit, adapted to generate a second signal and a third signal, the second signal generates an effective edge and the third signal generates an effective edge for resetting the first counting unit and the second counting unit every the second interval; a second comparing unit, adapted to compare the second reference counting value with the second feedback counting value and output a comparison result as a second prelock signal.

Optionally, the third detecting unit includes: a judging unit, adapted to judge whether the first prelock signal output from the first detecting unit is valid and whether the second prelock signal output from the second detecting unit is valid during an interval between two neighboring effective edges of the third signal and output a judging result; an outputting unit, adapted to output the judging result of the judging unit as a lock signal at the effective edge of the second signal.

To achieve the above object, the present invention provides a lock detection method for a PLL, including:

comparing a counting value of a reference clock signal with a counting value of a feedback clock signal every first interval, and outputting a valid first prelock signal if the counting value of the reference clock signal is equal to the counting value of the feedback clock signal;

outputting a valid second prelock signal when the counting value of the reference clock signal is equal to the counting value of the feedback clock signal during a second interval, the second interval at least two times higher than the first interval;

during the second interval, if the first prelock signal output every first interval and the second prelock signal are both valid, outputting a valid lock signal.

To achieve the above object, the present invention further provides a PLL including the above lock detector.

In above technical solutions, when it is determined that the counting value of the reference clock signal is equal to the counting value of the feedback clock signal during each first interval in the second interval and the counting value of the reference clock signal is also equal to the counting value of the feedback clock signal during the second interval, a valid lock signal is output so as to indicate that the feedback clock signal is stable. In other words, when the reference clock signal and the feedback clock signal are synchronous during a shorter time period (first interval) in a longer time period (second interval), it is determined that the PLL is in the lock status.

Compared with the prior art, because whether the reference clock signal and the feedback clock signal are synchronous is judged during each shorter time period, the longer time period does not need to be configured too long and the lock detection speed is improved. Moreover, because the valid lock signal is output when the reference clock signal and the feedback clock signal are synchronous during the longer time period and each shorter time period in the longer time period, the accuracy of the lock detection is high.

The lock detector in above technical solutions has a simple structure and is easy to be implemented. Moreover, the second interval may be shorter than the fixed time in the prior art. Thus, when the PLL including the lock detector is used in a SoC chip, the startup time of the system can be shortened.

DETAILED DESCRIPTION OF THE INVENTION

In one embodiment of the present invention, a longer time period is divided into at least two shorter time periods. Whether the reference clock signal and the feedback clock signal are synchronous are monitored for each shorter time period, and whether the reference clock signal and the feedback clock signal are synchronous are also monitored for the longer time period. If the reference clock signal and the feedback clock signal are synchronous both in the shorter time period and in the longer time period, it is determined that the PLL is in the lock status. A detailed description for the embodiment of the present invention will be given with reference to the Figures and preferable embodiments as below.

Figure 1:
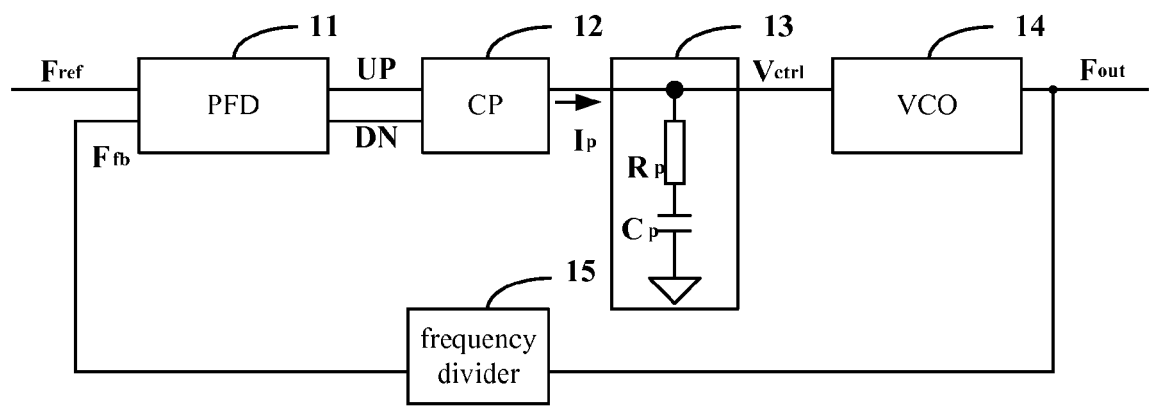
FIG. 1 shows the structure of PLL.
Figure 2:
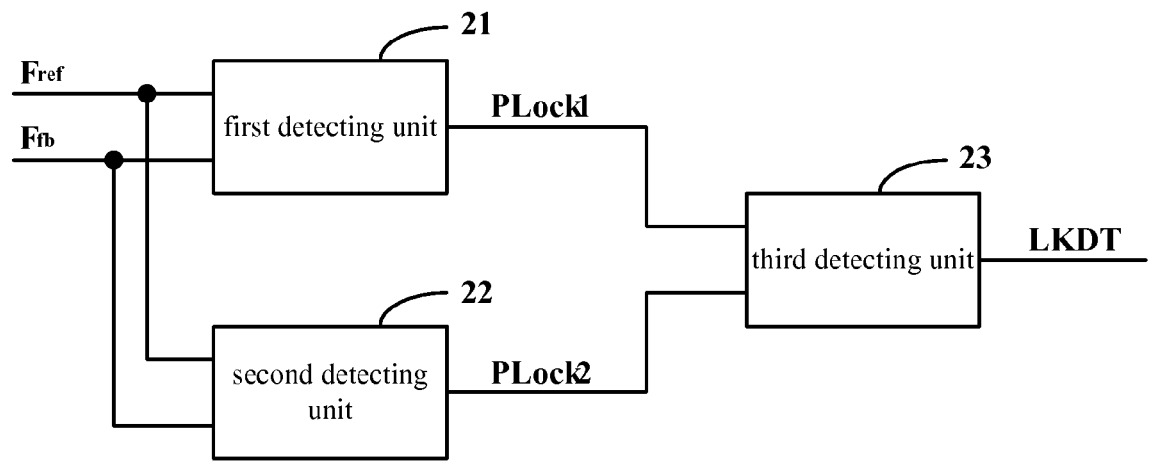
FIG. 2 shows the structure of the lock detector of the PLL according to one embodiment of the present invention.

Referring to FIG. 2, the lock detector in the PLL according to one embodiment of the present invention includes: a first detecting unit 21, a second detecting unit 22 and a third detecting unit 23.

The first detecting unit 21 is adapted to compare the counting value of the reference clock signal $F_{ref}$ and the counting value of the feedback clock signal $F_{fb}$ every first interval. If the two counting values are equal, the first detecting unit 21 outputs a valid first prelock signal PLock1.

The second detecting unit 22 is adapted to output a valid second prelock signal PLock2 when the counting value of the reference clock signal $F_{ref}$ is equal to the counting value of the feedback clock signal $F_{fb}$ 1 during a second interval. The second interval at least two times than the first interval.

The third detecting unit 23 is adapted to output a valid lock signal LKDT if the first prelock signals PLock1 output from the first detecting unit 21 every first interval are valid and the second prelock signal PLock2 output from the second detecting unit 22 is valid.

Particularly, in the case of a valid digital signal 1, the first detecting unit 21 compares the counting value of the reference clock signal $F_{ref}$ and the counting value of the feedback clock signal $F_{fb}$ every first interval. If the two counting values are equal, the first detecting unit 21 outputs a valid first prelock signal PLock1 i.e. PLock1=1. If the two counting values are not equal, the first detecting unit 21 outputs an invalid first prelock signal PLock1 i.e. PLock1=0. During the second interval, the second detecting unit 22 outputs a valid second prelock signal PLock2 i.e. PLock2=1 when the counting value of the reference clock signal $F_{ref}$ is equal to the counting value of the feedback clock signal $F_{fb}$ and outputs an invalid second prelock signal PLock2 i.e. PLock2=0 when the counting value of the reference clock signal $F_{ref}$ is not equal to the counting value of the feedback clock signal $F_{fb}$. During the second interval, if the first prelock signals PLock1 output from the first detecting unit 21 every first interval are all valid and the second prelock signal PLock2 output from the second detecting unit 22 is valid, the third detecting unit 23 outputs a valid lock signal i.e. LKDT=1, otherwise, the third detecting unit 23 outputs an invalid lock signal i.e. LKDT=0.

The second interval is configured according to the lock time of the PLL. Generally, the second interval is equal to or less than the lock time. The first interval and the second interval are accurate time period so as to count the reference clock signal $F_{ref}$ and the feedback clock signal $F_{fb}$ correctly. Because the reference clock signal $F_{ref}$ is an accurate and stable clock signal, the first interval and the second interval may be configured to be integral multiples of the period of the reference clock signal $F_{ref}$. Moreover, the second interval is more than or equal to two times of the first interval. Generally, the ratio between the first interval or the second interval to the period of the reference clock signal $F_{ref}$ is the nth power of 2 (n is a natural number) so as to facilitate the circuit design.

The lock detector divides a longer time period (i.e. the second interval) into two shorter intervals (i.e. the first interval), compares the counting value of the reference clock signal $F_{ref}$ and the counting value of the feedback clock signal $F_{fb}$ during each shorter interval. If the counting value of the reference clock signal $F_{ref}$ is equal to the counting value of the feedback clock signal $F_{fb}$ during the longer time period and the counting value of the reference clock signal $F_{ref}$ is equal to the counting value of the feedback clock signal $F_{fb}$ during each shorter interval, the reference clock signal $F_{ref}$ and the feedback clock signal $F_{fb}$ are synchronous during the longer time period and the reference clock signal $F_{ref}$ and the feedback clock signal $F_{fb}$ are synchronous during each shorter interval. Because the reference clock signal $F_{ref}$ is a stable clock signal, the feedback clock signal $F_{fb}$ is also stable. Because the feedback clock signal $F_{fb}$ is equal to the output clock signal $F_{out}$ (when the frequency division factor is 1) of the PLL or the feedback clock signal $F_{fb}$ is obtained by dividing the output clock signal $F_{out}$ (when the frequency division factor is larger than 1), the status of feedback clock signal $F_{fb}$ reflects the status of the output clock signal $F_{out}$. When the feedback clock signal $F_{ref}$ is stable, the output clock signal $F_{out}$ is also stable and thus, it is determined that the PLL is in the lock status.

Additionally, the more the number of shorter intervals (i.e. the first interval) obtained from the longer time period (i.e. the second interval) is, the higher the accuracy indicating whether the feedback signal $F_{fb}$ is stable is. Generally, the ratio between the first interval to the period of the reference clock signal is less than or equal to 32 and the ratio between the second interval to the period of the reference clock signal is at least 128.

Figure 3:
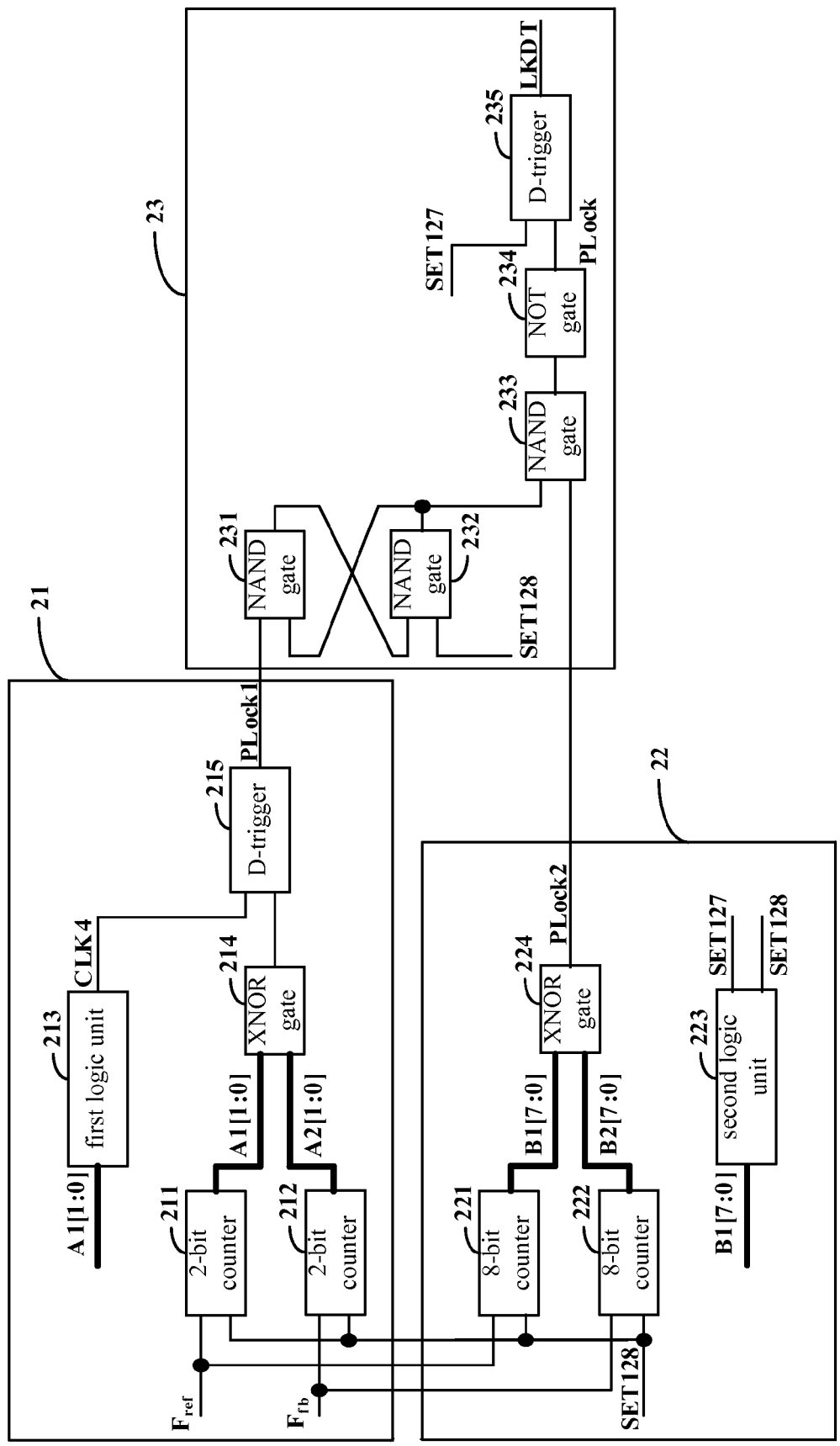
FIG. 3 shows the circuit diagram of the lock detector according to one embodiment of the present invention.

FIG. 3 shows the circuit diagram of the lock detector according to one embodiment of the present invention. In this embodiment, the first interval is $4T_{ref}$ and the second interval is $128 T_{ref}$, where the $T_{ref}$ is the period of the reference clock signal. As shown in FIG. 3, the lock detector includes a first detecting unit 21, a second detecting unit 22 and a third detecting unit 23.

The first detecting unit 21 compares the counting value of the reference clock signal $F_{ref}$ and the counting value of the feedback clock signal $F_{fb}$ every $4T_{ref}$. If the counting values are the same, the first detecting unit 21 outputs a first prelock signal of 1 i.e. PLock1=1; otherwise, the first detecting unit 21 outputs a first prelock signal of 0 i.e. PLock1=0.

The second detecting unit 22 compares the counting value of the reference clock signal $F_{ref}$ and the counting value of the feedback clock signal $F_{fb}$ during $128T_{ref}$. If the counting values are the same, the second detecting unit 22 outputs a second prelock signal of 1 i.e. PLock2=1; otherwise, the second detecting unit 22 outputs a second prelock signal of 0 i.e. PLock2=0.

During $128T_{ref}$, if the first prelock signal PLock1 output from the first detecting unit 21 at every $4T_{ref}$ is 1 and the second prelock signal PLock2 output from the second detecting unit 22 is 1, the third detecting unit 23 outputs a lock signal LKDT of 1 i.e. LKDT=1; otherwise, the third detecting unit 23 outputs a lock signal LKDT of 0 i.e. LKDT=0.

The first detecting unit 21 includes a first counting unit (not shown), a first logic unit 213 and a first comparing unit (not shown).

The first counting unit counts the reference clock signal $F_{ref}$ and the feedback clock signal $F_{fb}$ and includes two 2-bit counters 211, 212. The counter 211 counts the reference clock signal $F_{ref}$ and outputs a first reference counting value A1 [1:0] of 2 bits. The counter 212 counts the feedback clock signal $F_{fb}$ and outputs a first feedback counting value A2 [1:0] of 2 bits. The number of the bits for the first reference counting value and the first feedback counting value is determined by the first interval. In this embodiment, the first interval is equal to $4T_{ref}$ i.e. $2^2T_{ref}$. Thus, the number of the bits for the first reference counting value and the first feedback counting value are 2.

Figure 4:
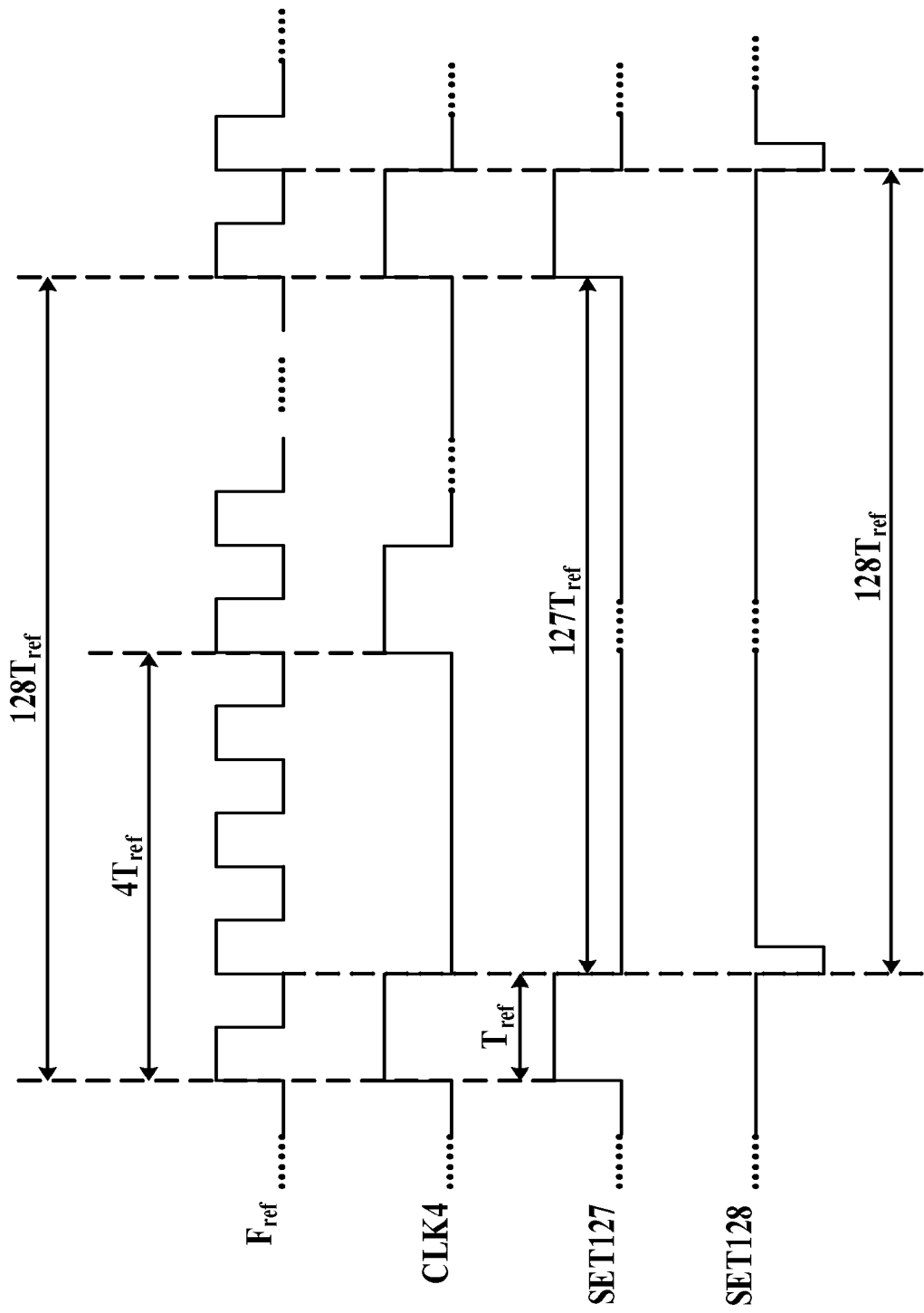
FIG. 4 shows the timing relation among a first signal, a second signal, a third signal and the reference clock signal.

The first logic unit 213 generates a first signal CLK4 according to the input first reference counting value A1 [1:0]. The first signal CLK4 generates effective edge every first interval. In this embodiment, CLK4=A1[1]&A1[0], the effective edge of the first signal CLK4 is the rising edge. Alternatively, the effective edge of the first signal CLK4 may also be the falling edge. The timing order of the first signal CLK4 is shown in FIG. 4. As shown in FIG. 4, the first signal CLK4 generates one rising edge every four $4T_{ref}$ and generates one falling edge after one $T_{ref}$. The period of the first signal CLK4 is $4T_{ref}$, where the high pulse width is one $T_{ref}$ and the low pulse width is three $T_{ref}$.

The first comparing unit compares the first reference counting value A1[1:0] with the first feedback counting value A2[1:0] and outputs a comparison result as the first prelock signal PLock1 at an effective edge of the first signal CLK4 (the rising edge in this embodiment). The first comparing unit includes a first XNOR gate 214 and a first D-trigger (DFF) 215. The input of the first XNOR gate includes the first reference counting value A1[1:0] and the first feedback counting value A2[1:0]. The output terminal of the first XNOR gate 214 is connected with the data input terminal of the first D-trigger 215. The first signal CLK4 is input through the clock input terminal of the first D-trigger 215 and the first prelock signal PLock1 is output through the output terminal of the first D-trigger 215. At the rising edge of the first clock CLK4, if the first reference counting value A1[1:0] is equal to the first feedback counting value A2[1:0], the first prelock signal PLock is equal to 1, and if the first reference counting value A1[1:0] is not equal to the first feedback counting value A2[1:0], the first prelock signal PLock is equal to 0.

The second detecting unit 22 includes a second counting unit (not shown), a second logic unit 223 and a second comparing unit 224.

The second counting unit counts the reference clock signal $F_{ref}$ and the feedback clock signal $F_{fb}$ and includes two 8-bit counters 221, 222. The counter 221 counts the reference clock signal $F_{ref}$ and outputs a second reference counting value B1 [7:0] of 8 bits. The counter 222 counts the feedback clock signal $F_{fb}$ and outputs a second feedback counting value B2 [7:0] of 8 bits. The number of the bits for the second reference counting value and the second feedback counting value is determined by the second interval. In this embodiment, the second interval is equal to $128T_{ref}$ i.e. $2^7T_{ref}$. Considering the resetting of the counter (with reference to the third signal SET128 of the second logic unit 223), the number of the bits for the counter 221, 222, the second reference counting value and the second feedback counting value is 8 i.e. (7+1)bit=8 bit.

The second logic unit 223 generates a second signal SET127 and a third signal SET128 according to the input second reference counting value B1 [7:0]. Every second interval, the second signal SET127 generates an effective edge and the third signal SET128 generates an effective edge for resetting the first counting unit and the second counting unit. In this embodiment, $$SET127 = \overline{B1[7]} \& B1[6] \& B1[5] \& B1[4] \& B1[3] \& B1[2] \& B1[1] \& B1[0];$$

$$SET128 = \overline{B1[7] \& \overline{B1[6]} \& B1[5] \& \overline{B1[4]} \& B1[3] \& \overline{B1[2]} \& \overline{B1[1]} \& \overline{B1[0]}}$$

the effective edge of the second signal SET127 is a rising edge and the effective edge of the third signal SET128 is a falling edge. The timing order of the second signal SET127 and the third signal ST128 are shown in FIG. 4. As shown in FIG. 4, the second signal SET127 generates one rising edge every 128T$_{ref}$ and generates one falling edge after one T$_{ref}$. The second signal SET127 generates the rising edge when the second reference counting value B1[7:0] is 127. The period of the second signal SET127 is 128T$_{ref}$, where, the high pulse width is one T$_{ref}$ and the low pulse width is 127 T$_{ref}$. After the second signal SET127 generates the falling edge, the third signal SET128 generates one falling edge. The third signal SET128 generates the falling edge when the second reference counting value B1[7:0] is 128. The third signal SET128 is input to the 2-bit counters 211, 211 and the 8-bit counters 221, 222 as the resetting signal. In other words, the 2-bit counters 211, 211 in the first counting unit and the 8-bit counters 221, 222 in the second counting unit are reset when the third signal SET128 is 0. After the 8-bit counter 221 is reset, the third signal SET128 generates a rising edge. The period of the third signal SET128 is 128T$_{ref}$. The effective edge (falling edge) of the third signal SET128 offsets the effective edge (rising edge) of the second signal SET127 by one T$_{ref}$.

The second comparing unit 224 compares the second reference counting value B1[7:0] with the second feedback counting value B2[7:0] and outputs a comparison result as the second prelock signal PLock2. If the second reference counting value B1[7:0] is equal to the second feedback counting value B2[7:0], the second prelock signal PLock 2 is equal to 1 i.e. PLock2=1. If the second reference counting value B1[7:0] is not equal to the second feedback counting value B2[7:0], the second prelock signal PLock2 is equal to 0 i.e. PLock2=0. In this embodiment, the second comparing unit 224 is the XNOR gate.

The third detecting unit 23 includes a judging unit and an output unit (not shown).

The judging unit 23 judges whether the first prelock signal PLock1 output from the first detecting unit 21 is 1 and whether the second prelock signal PLock2 output from the second detecting unit 22 is 1 during an interval between two neighboring effective edges (the falling edge in this embodiment) of the third signal SET128. The judging unit 23 outputs a judging result PLock. When the first prelock signal PLock1 output from the first detecting unit 21 is 1 and the second prelock signal PLock2 output from the second detecting unit 22 is 1 during the interval between two neighboring the falling edge (i.e. during 128 T$_{ref}$), the output judging result PLock is equal to 1 i.e. PLock=1; otherwise, the output judging result PLock is equal to 0 i.e. PLock=0.

The judging unit includes a first NAND gate 231, a second NAND gate 232, a third NAND gate 233 and a NOT gate 234. The first prelock signal PLock1 is input to the first NAND gate through an input terminal of the first NADN gate 231. The other input terminal of the first NAND 231 is connected with the output terminal of the second NAND gate 232. The output terminal of the first NAND gate 231 is connected to one input terminal of the second NAND gate 232. The third signal SET128 is input through the other input terminal of the second NAND gate 232. One input terminal of the third NAND gate 233 is connected to the output terminal of the second NAND gate 232. The second prelock signal PLock2 is input through the other input terminal of the third NAND gate 233. The output terminal of the third NAND gate 233 is connected to the input terminal of the NOT gate 234. The output terminal of the NOT gate 234 outputs the judging result PLock.

The output unit outputs the judging result PLock of the judging unit as the lock signal LKDT during the effective edge (the rising edge in this embodiment) of the second signal SET127. The output unit includes a second D-trigger 235. The judging result PLock is input through the data input terminal of the second D-trigger 235 and the second signal SET127 is input through the clock input terminal of the second D-trigger 235. The lock signal LKDT is output from the output terminal of the second D-trigger 235.

Figure 5:
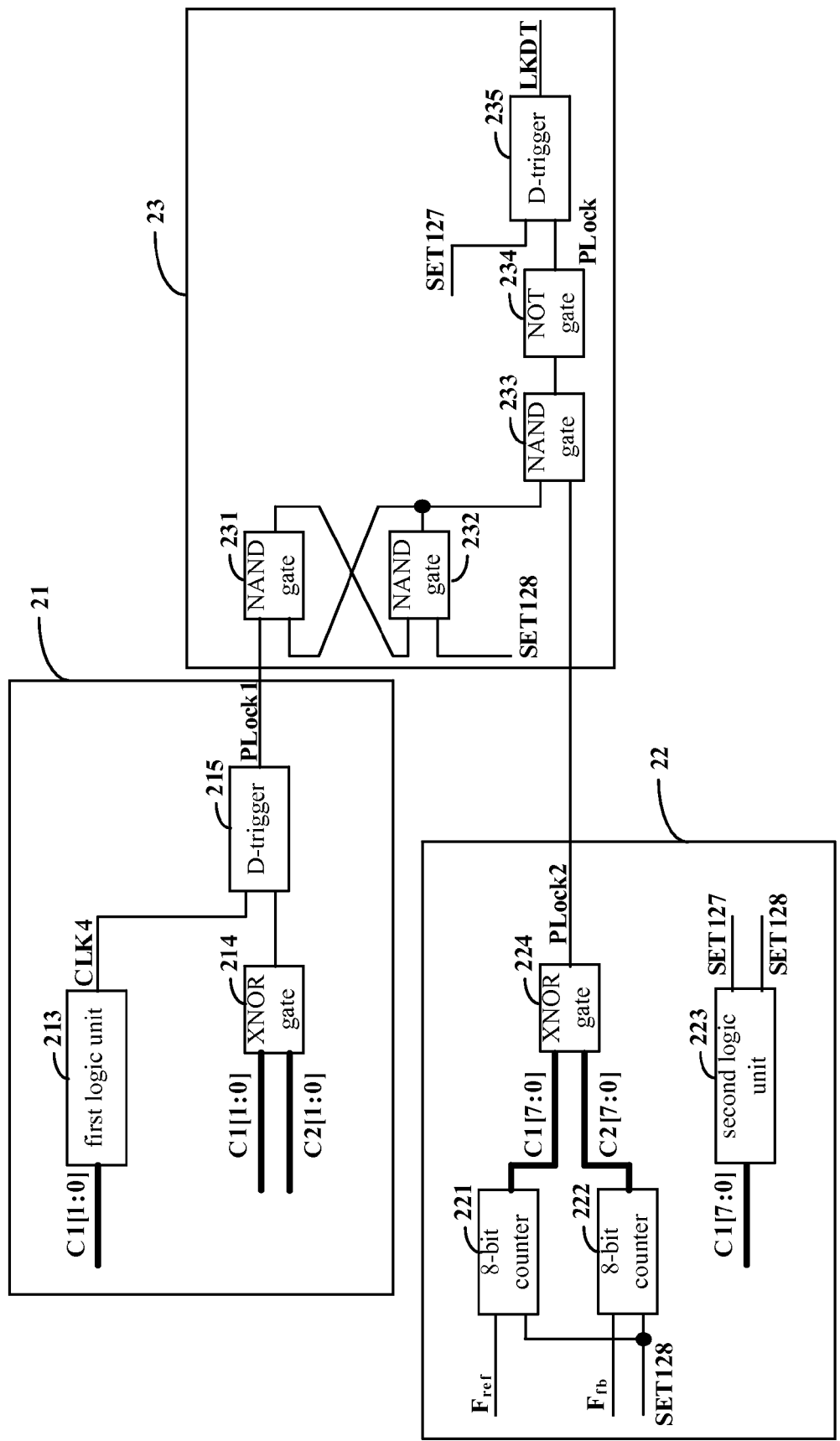
FIG. 5 shows the circuit diagram of the lock detector according to anther embodiment of the present invention.

Those skilled in the art can appreciate that other unit or logic gate different from that in FIG. 3 may also be used to implement the same function. For example, the third NAND gate 233 and the NOT gate 234 in the judging unit of FIG. 3 may be replaced with an AND gate. As an another example, the 2-bit counters 211, 211 in FIG. 3 may also be omitted. As shown in FIG. 5, the first detecting unit 21 includes: a first logic unit 213, a first comparing unit (including a XNOR gate 214 and a first D-trigger 215). The second detecting unit 22 includes a counting unit, a second logic unit 223 and a second comparing unit 224 (including a XNOR gate). The counting unit of the second detecting unit 22 includes two 8-bit counters 221, 222. The counter 221 counts the reference clock signal F$_{fb}$ and outputs a 8-bit first counting value C1[7:0]. The counter 222 counts the feedback clock signal F$_{fb}$ and outputs a 8-bit second counting value C2[7:0]. Two low-bit value C1[1:0] of the first counting value C1[7:0] is input to the first logic unit 213 of the first detecting unit 21. The input of the first comparing unit includes two low-bit value C1[1:0] of the first counting value C1[7:0] and two low-bit value C2[1:0] of the second counting value C2[7:0]. The first counting value C1 [7:0] is input to the second logic unit 223 of the second detecting unit 22 and the input of the second comparing unit 224 includes a first counting value C1[7:0] and a second counting value C2[7:0].

Figure 6:
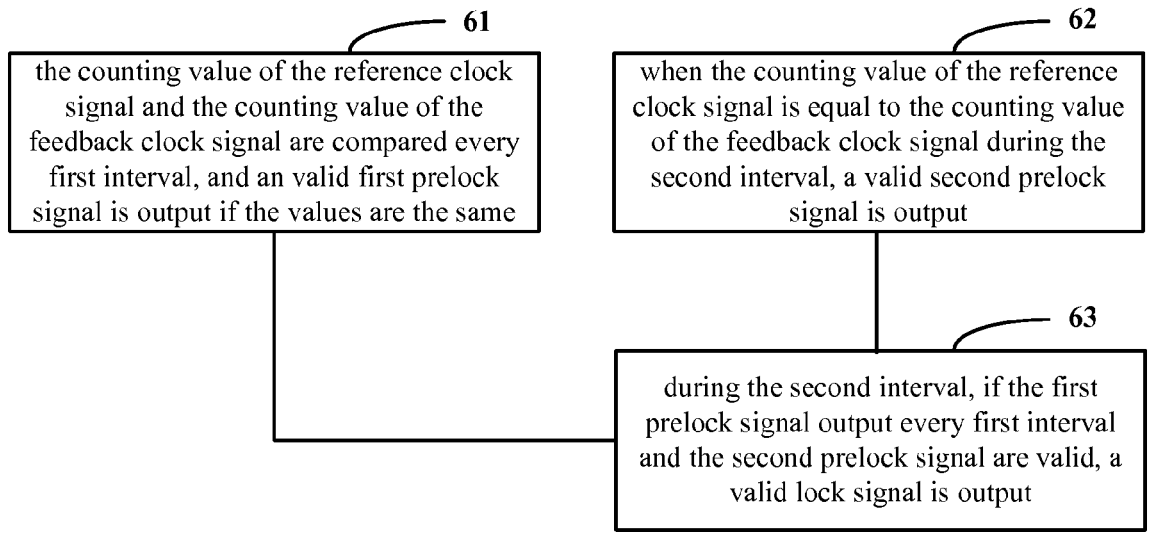
FIG. 6 shows the flow chart of the lock detection method for the PLL according to one embodiment of the present invention.

FIG. 6 shows the flow chart of the lock detection method for the PLL according to one embodiment of the present invention.

At step S61, the counting value of the reference clock signal and the counting value of the feedback clock signal are compared every first interval. If the values are the same, a valid first prelock signal is output.

At step S62, when the counting value of the reference clock signal is equal to the counting value of the feedback clock signal during the second interval, a valid second prelock signal is output. The second interval at least two times higher than the first interval.

At step S63, during the second interval, if the first prelock signal output every first interval and the second prelock signal are valid, a valid lock signal is output.

The first interval and the second interval may be configured to as integral multiples of the period of the reference clock signal.

The ratio between the first interval to the period of the reference clock signal is equal to or less than 32 and the ratio between the second interval to the period of the reference clock signal is larger than or equal to 128.

Figure 7:
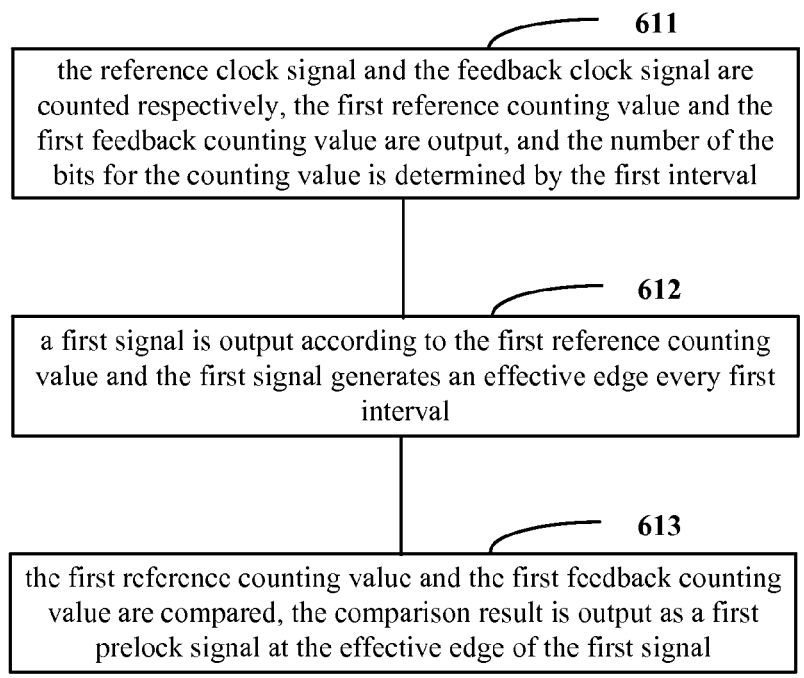
FIG. 7 shows the flow chart of step S61 illustrated in FIG. 6.

As shown in FIG. 7, the step S61 further includes step S611, S612 and S613. At step S611, the reference clock signal and the feedback clock signal are counted respectively. The first reference counting value and the first feedback counting value are output. The number of the bits for the counting value is determined by the first interval. At step S612, a first signal is output according to the first reference counting value and the first signal generates an effective edge every first interval. At step S613, the first reference counting value and the first feedback counting value are compared. The comparison result is output as a first prelock signal at the effective edge of the first signal.

Figure 8:
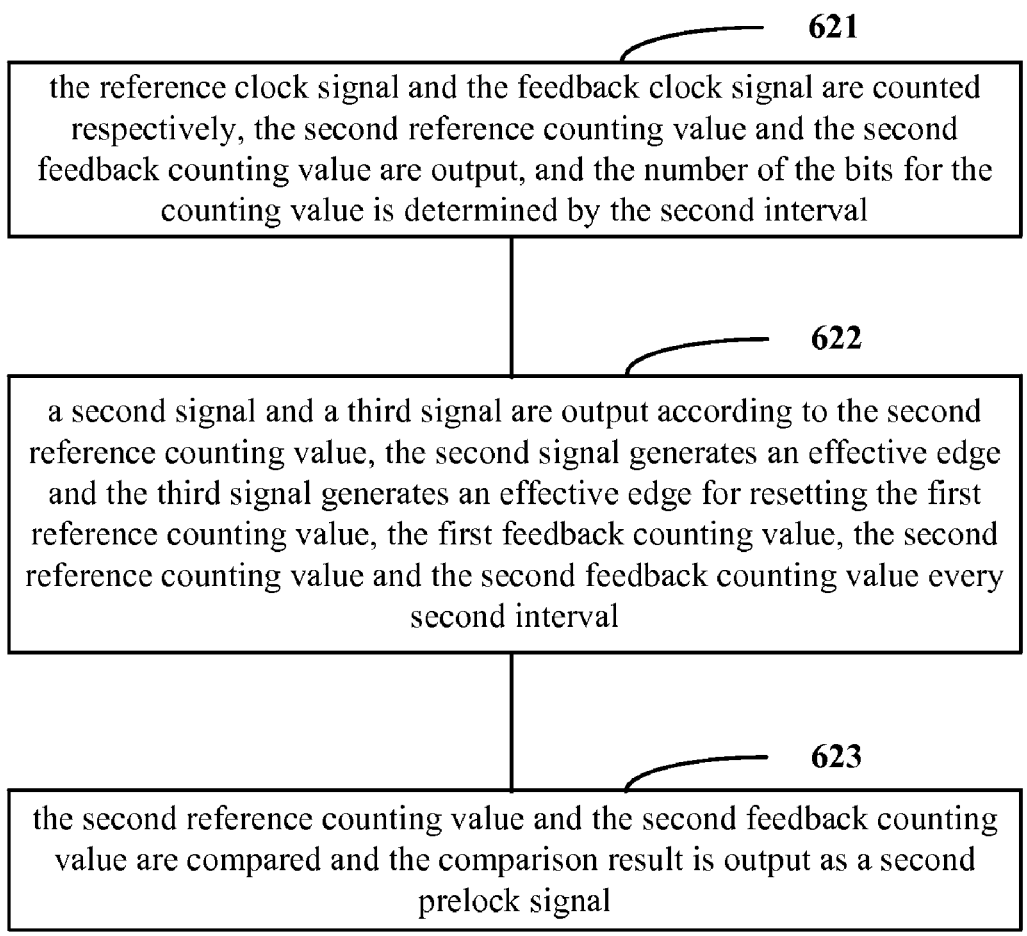
FIG. 8 shows the flow chart of step S62 illustrated in FIG. 6.

As shown in FIG. 8, the step S62 further includes step S621, step S622 and step S623. At step S621, the reference clock signal and the feedback clock signal are counted respectively. The second reference counting value and the second feedback counting value are output. The number of the bits for the counting value is determined by the second interval. At step S622, a second signal and a third signal are output according to the second reference counting value. Every second interval, the second signal generates an effective edge and the third signal generates an effective edge for resetting the first reference counting value, the first feedback counting value, the second reference counting value and the second feedback counting value. At step S623, the second reference counting value and the second feedback counting value are compared and a comparison result is output as a second prelock signal.

Figure 9:
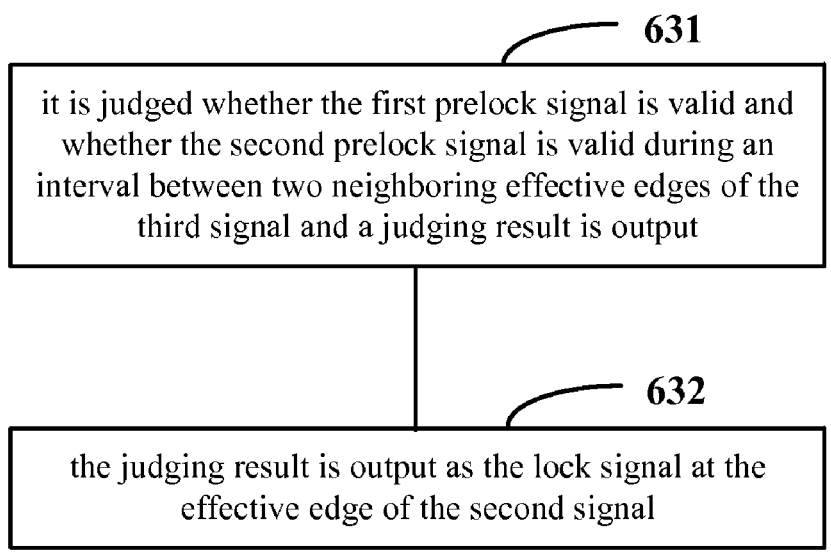
FIG. 9 shows the flow chart of step S63 illustrated in FIG. 6.

As shown in FIG. 9, the step S63 includes step S631 and step S632. At step S631, it is judged whether the first prelock signal is valid and whether the second prelock signal is valid during an interval between two neighboring effective edges of the third signal and a judging result is output. At step S632, the judging result is output as the lock signal at the effective edge of the second signal.

Figure 10:
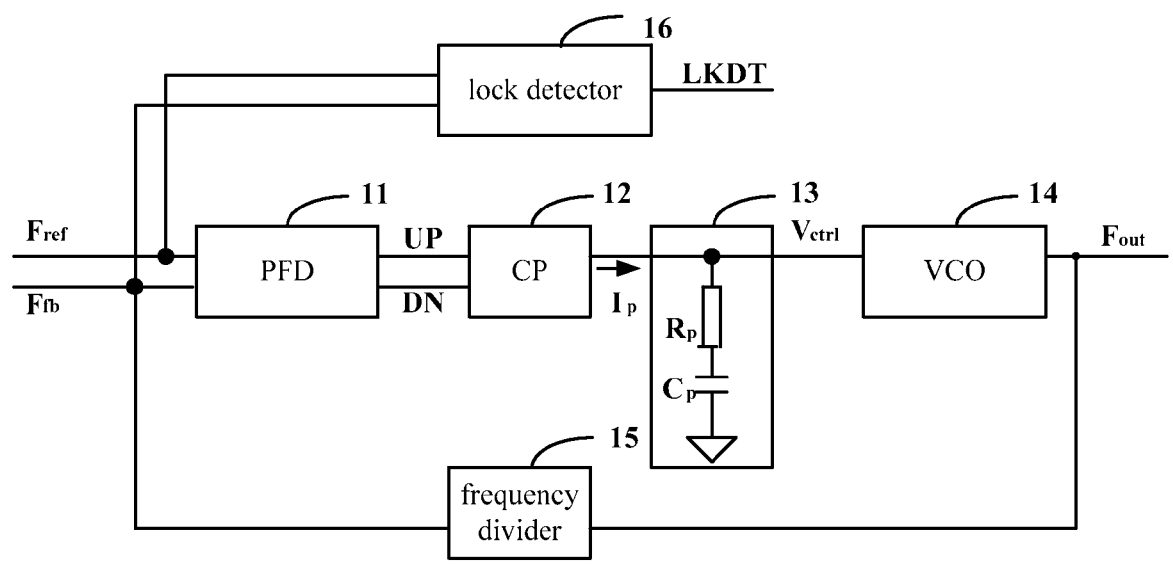
FIG. 10 shows the structure of the PLL according to one embodiment of the present invention.

The PLL according to one embodiment of the present invention is as shown in FIG. 10. The PLL includes a PFD 11, a CP 12, a LF 13, a VCO 14, a frequency divider 15 and a lock detector 16.

The PFD 11 detects a frequency difference and a phase difference between the reference clock signal $F_{ref}$ and the feedback clock signal $F_{fb}$ and generates pulse control signals UP and DN. For example, when a phase of the feedback clock signal $F_{fb}$ lags behind that of the reference clock signal $F_{ref}$, a pulse width of the pulse control signal UP is larger than that of the pulse control signal DN. When the phase of the feedback clock signal $F_{fb}$ leads over that of the reference clock signal $F_{ref}$, the pulse width of the pulse control signal UP is smaller than that of the pulse control signal DN.

The CP 12 generates a charging or discharging current $I_p$ according to the pulse control signals UP and DN output from the PFD 11. When the phase of the feedback clock signal $F_{fb}$ lags behind that of the reference clock signal $F_{ref}$, the pulse width of the pulse control signal UP is larger than that of the pulse control signal DN and the CP 12 outputs the charging current $I_p$. When the phase of the feedback clock signal $F_{fb}$ leads over that of the reference clock signal $F_{ref}$, the pulse width of the pulse control signal UP is smaller than that of the pulse control signal DN and the CP 12 outputs the discharging current $I_p$.

The LF 13 generates a control voltage $V_{ctrl}$ according to the charging or discharging current $I_p$ output from CP 12. The capacitor $C_p$ is charged when the CP 12 outputs the charging current $I_p$, and thus, the control voltage $V_{ctrl}$ is increased. The capacitor $C_p$ is discharged when the CP 12 outputs the discharging current $I_p$, and thus, the control voltage $V_{ctrl}$ is decreased.

The VCO 14 controls an oscillation frequency of an output clock signal $F_{out}$ according to the control voltage $V_{ctrl}$ output from LF 13. The oscillation frequency of the output clock signal $F_{out}$ is increased when the control voltage $V_{ctrl}$ is increased and the oscillation frequency of the output clock signal $F_{out}$ is decreased when the control voltage $V_{ctrl}$ is dropped.

The frequency divider 15 divides the output clock signal $F_{out}$ and generates the feedback clock signal $F_{fb}$.

The lock detector 16 outputs a valid lock signal LKDT if the counting value of the reference clock signal $F_{ref}$ is equal to the counting value of the feedback clock signal $F_{fb}$ during every first interval and the counting value of the reference clock signal $F_{ref}$ is equal to the counting value of the feedback clock signal $F_{fb}$ during the second interval. FIG. 2 shows the structure of the lock detector and FIG. 3 or 5 shows the detailed circuit schematic of the lock detector. The lock detector may also be replaced with other circuit having the same function and repeated descriptions thereof are omitted herein.

In another embodiment, if the frequency division factor is 1, the frequency divider may not be included in the PLL. In other words, the output clock signal is directly input to the PFD 11 and the lock detector 16 as the feedback clock signal.

Although the present invention has been disclosed as above with reference to preferred embodiments thereof but will not be limited thereto. Those skilled in the art can modify and vary the embodiments without departing from the spirit and scope of the present invention. Accordingly, the scope of the present invention shall be defined in the appended claims.

What is claimed is:

1. A lock detector for a Phase Locked Loop, PLL, comprising:
   a first detecting unit, adapted to compare a counting value of a reference clock signal with a counting value of a feedback clock signal every first interval and output a valid first prelock signal when the counting value of the reference clock signal is equal to the counting value of the feedback clock signal;
   a second detecting unit, adapted to output a valid second prelock signal when the counting value of the reference clock signal is equal to the counting value of the feedback clock signal during a second interval which is at least two times higher than the first interval;
   a third detecting unit, adapted to output a valid lock signal if the first prelock signal output from the first detecting unit every first interval is valid and the second prelock signal output from the second detecting unit is valid during the second interval.

2. The lock detector according to claim 1, wherein, the first interval and the second interval are integral multiples of a period of the reference clock signal.

3. The lock detector according to claim 2, wherein, a ratio between the first interval to the period of the reference clock signal is equal to or less than 32 and a ratio between the second interval to the period of the reference clock signal is larger than or equal to 128.

4. The lock detector according to claim 1, wherein, the first detecting unit comprises:
   a first counting unit, adapted to count the reference clock signal and the feedback clock signal, output a first reference counting value and a first feedback counting value, the number of bits for the counting value is determined by the first interval;
   a first logic unit, adapted to generate a first signal which generates an effective edge every the first interval according to the first reference counting value;

a first comparing unit, adapted to compare the first reference counting value with the first feedback counting value and output a comparison result as a first prelock signal at the effective edge of the first signal.

5. The lock detector according to claim 4, wherein, the second detecting unit comprises:
   a second counting unit, adapted to count the reference clock signal and the feedback clock signal respectively, output the second reference counting value and the second feedback counting value, the number of bits for the counting value is determined by the second interval;
   a second logic unit, adapted to generate a second signal and a third signal, the second signal generates an effective edge and the third signal generates an effective edge for resetting the first counting unit and the second counting unit every the second interval;
   a second comparing unit, adapted to compare the second reference counting value with the second feedback counting value and output a comparison result as a second prelock signal.

6. The lock detector according to claim 1, wherein, the second detecting unit comprises:
   a counting unit, adapted to count the reference clock signal and the feedback clock signal, output a first counting value and a second counting value, the number of bits for the counting value is determined by the second interval;
   a second logic unit, adapted to generate a second signal and a third signal according to the first counting value, the second signal generates an effective edge and the third signal generates an effective edge for resetting the counting unit every the second interval;
   a second comparing unit, adapted to compare a first counting value with a second counting value and output a comparison result as a second prelock signal;
   the first detecting unit comprises:
   a first logic unit, adapted to generates a first signal which generates an effective edge every the first interval;
   a first comparing unit, adapted to compare the first counting value with the second counting value, output a comparison result as the first prelock signal at the effective edge of the first signal, the number of bits for the counting value is determined by the first interval.

7. The lock detector according to claim 5, wherein, the third detecting unit comprises:
   a judging unit, adapted to judge whether the first prelock signal output from the first detecting unit is valid and whether the second prelock signal output from the second detecting unit is valid during an interval between two neighboring effective edges of the third signal and output a judging result;
   an outputting unit, adapted to output the judging result of the judging unit as a lock signal at the effective edge of the second signal.

8. The lock detector according to claim 6, wherein, the third detecting unit comprises:
   a judging unit, adapted to judge whether the first prelock signal output from the first detecting unit is valid and whether the second prelock signal output from the second detecting unit is valid during an interval between two neighboring effective edges of the third signal and output a judging result;
   an outputting unit, adapted to output the judging result of the judging unit as a lock signal at the effective edge of the second signal.

9. A lock detection method for a Phase Locked Loop, PLL, comprising:
   comparing a counting value of a reference clock signal with a counting value of a feedback clock signal every first interval, and outputting a valid first prelock signal if the counting value of the reference clock signal is equal to the counting value of the feedback clock signal;
   outputting a valid second prelock signal when the counting value of the reference clock signal is equal to the counting value of the feedback clock signal during a second interval, the second interval at least two times higher than the first interval;
   during the second interval, if the first prelock signal output every first interval and the second prelock signal are both valid, outputting a valid lock signal.

10. The lock detection method according to claim 9, wherein, the first interval and the second interval are integral multiples of a period of the reference clock signal.

11. The lock detection method according to claim 9, a ratio between the first interval to the period of the reference clock signal is equal to or less than 32 and a ratio between the second interval to the period of the reference clock signal is larger than or equal to 128.

12. The lock detection method according to claim 9, wherein, the first prelock signal is output through the following steps:
   counting the reference clock signal and the feedback clock signal, outputting a first reference counting value and a first feedback counting value, wherein the number of bits of the counting value is determined by the first interval;
   generating a first signal which generates an effective edge every first interval according to the first reference counting value;
   comparing the first reference counting value with the first feedback counting value, and outputting a comparison result at the effective edge of the first signal as the first prelock signal.

13. The lock detection method according to claim 12, wherein, the second prelock signal is output through the following steps:
   counting the reference clock signal and the feedback clock signal, outputting a second reference counting value and a second feedback counting value, wherein the number of bits of the counting value is determined by the second interval;
   generating a second signal and a third signal according to the second reference counting value, the second signal generates an effective edge and the third signal generates an effective edge for resetting the first reference counting value, the first feedback counting value, the second reference counting value and the second feedback counting value every the second interval;
   comparing the second reference counting value with the second feedback counting value, and outputting a comparison result as the second prelock signal.

14. The lock detection method according to claim 13, wherein, the lock signal is output through the following steps:
   judging whether the first prelock signal is valid and whether the second prelock signal is valid during an interval between two neighboring effective edges of the third signal and outputting a judging result;
   outputting the judging result as a lock signal at the effective edge of the second signal.

15. A Phase Locked Loop, PLL, comprising a lock detector, wherein, the lock detector comprises:
  a first detecting unit, adapted to compare a counting value of a reference clock signal with a counting value of a feedback clock signal every first interval and output a valid first prelock signal when the counting value of the reference clock signal is equal to the counting value of the feedback clock signal;
  a second detecting unit, adapted to output a valid second prelock signal when the counting value of the reference clock signal is equal to the counting value of the feedback clock signal during a second interval which is two times higher than the first interval;
  a third detecting unit, adapted to output a valid lock signal if the first prelock signal output from the first detecting unit during every first interval is valid and the second prelock signal output from the second detecting unit is valid during the second interval.

16. The PLL according to claim 15, wherein, the first interval and the second interval are integral multiples of a period of the reference clock signal.

17. The PLL according to claim 15, wherein, a ratio between the first interval to the period of the reference clock signal is equal to or less than 32 and a ratio between the second interval to the period of the reference clock signal is larger than or equal to 128.

18. The PLL according to claim 15, wherein, the first detecting unit comprises:
  a first counting unit, adapted to count the reference clock signal and the feedback clock signal, output a first reference counting value and a first feedback counting value, the number of bits for the counting value is determined by the first interval;
  a first logic unit, adapted to generate a first signal which generates an effective edge every the first interval according to the first reference counting value;
  a first comparing unit, adapted to compare the first reference counting value with the first feedback counting value and output a comparison result as a first prelock signal at the effective edge of the first signal.

19. The PLL according to claim 18, wherein, the second detecting unit comprises:
  a second counting unit, adapted to count the reference clock signal and the feedback clock signal respectively, output the second reference counting value and the second feedback counting value, the number of bits for the counting value is determined by the second interval;
  a second logic unit, adapted to generate a second signal and a third signal, the second signal generates an effective edge and the third signal generates an effective edge for resetting the first counting unit and the second counting unit every the second interval;
  a second comparing unit, adapted to compare the second reference counting value with the second feedback counting value and output a comparison result as a second prelock signal.

20. The PLL according to claim 15, wherein, the second detecting unit comprises:
  a counting unit, adapted to count the reference clock signal and the feedback clock signal, output a first counting value and a second counting value, the number of bits for the counting value is determined by the second interval;
  a second logic unit, adapted to generate a second signal and a third signal according to the first counting value, the second signal generates an effective edge and the third signal generates an effective edge for resetting the counting unit every the second interval;
  a second comparing unit, adapted to compare a first counting value with a second counting value and output a comparison result as a second prelock signal;
  the first detecting unit comprises:
  a first logic unit, adapted to generates a first signal which generates an effective edge every the first interval;
  a first comparing unit, adapted to compare the first counting value with the second counting value, output a comparison result as the first prelock signal at the effective edge of the first signal, the number of bits for the counting value is determined by the first interval.

21. The PLL according to claim 19, wherein, the third detecting unit comprises:
  a judging unit, adapted to judge whether the first prelock signal output from the first detecting unit is valid and whether the second prelock signal output from the second detecting unit is valid during an interval between two neighboring effective edges of the third signal and output a judging result;
  an outputting unit, adapted to output the judging result of the judging unit as a lock signal at the effective edge of the second signal.

22. The PLL according to claim 20, wherein, the third detecting unit comprises:
  a judging unit, adapted to judge whether the first prelock signal output from the first detecting unit is valid and whether the second prelock signal output from the second detecting unit is valid during an interval between two neighboring effective edges of the third signal and output a judging result;
  an outputting unit, adapted to output the judging result of the judging unit as a lock signal at the effective edge of the second signal.

* * * * *